United States Patent
Aisaka et al.

(10) Patent No.: US 10,624,207 B2
(45) Date of Patent: Apr. 14, 2020

(54) TOUCH SENSOR

(71) Applicant: Panasonic Intellectual Property Management Co., Ltd., Osaka (JP)

(72) Inventors: Tsutomu Aisaka, Osaka (JP); Hirotoshi Watanabe, Osaka (JP); Shigeki Sato, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/488,132

(22) PCT Filed: Mar. 8, 2018

(86) PCT No.: PCT/JP2018/008925
§ 371 (c)(1),
(2) Date: Aug. 22, 2019

(87) PCT Pub. No.: WO2018/168627
PCT Pub. Date: Sep. 20, 2018

(65) Prior Publication Data
US 2019/0387622 A1    Dec. 19, 2019

(30) Foreign Application Priority Data

Mar. 14, 2017 (JP) ................. 2017-048084

(51) Int. Cl.
*H05K 1/11* (2006.01)
*H05K 3/10* (2006.01)
*H05K 3/32* (2006.01)

(52) U.S. Cl.
CPC ............. *H05K 1/11* (2013.01); *H05K 3/102* (2013.01); *H05K 3/107* (2013.01); *H05K 3/323* (2013.01)

(58) Field of Classification Search
CPC .......... H05K 1/11; H05K 1/111; H05K 3/107; H05K 3/323
See application file for complete search history.

(56) References Cited

U.S. PATENT DOCUMENTS

| | | | |
|---|---|---|---|
| 6,506,978 B1 * | 1/2003 | Furihata | G02F 1/13452 174/254 |
| 2006/0071984 A1 * | 4/2006 | Hirai | G02F 1/136286 347/68 |

(Continued)

FOREIGN PATENT DOCUMENTS

JP    2014-081870    5/2014

OTHER PUBLICATIONS

International Search Report of PCT application No. PCT/JP2018/008925 dated Apr. 10, 2018.

*Primary Examiner* — Hoa C Nguyen
(74) *Attorney, Agent, or Firm* — McDermott Will & Emery LLP

(57) ABSTRACT

A touch sensor of this disclosure includes: a printed circuit board having a connection terminal; a substrate portion having a mounting portion on which the printed circuit board is mounted; a conductive layer disposed on the mounting portion of the substrate portion; and an adhesive agent connecting the connection terminal and the conductive layer to each other. A plurality of linear projections arranged in a first direction and extending in a second direction intersecting with the first direction are disposed on a surface of the substrate portion at the mounting portion, and the conductive layer is disposed on a groove portion positioned between the linear projections disposed adjacently to each other out of the plurality of linear projections.

8 Claims, 7 Drawing Sheets

(56) References Cited

U.S. PATENT DOCUMENTS

| | | | |
|---|---|---|---|
| 2009/0237903 A1* | 9/2009 | Onodera | G02F 1/1345 361/780 |
| 2012/0231689 A1* | 9/2012 | Kim | C09J 133/08 442/181 |
| 2012/0319980 A1* | 12/2012 | Nagaoka | H05K 1/0269 345/173 |
| 2012/0320542 A1* | 12/2012 | Jeong | B32B 37/1284 361/749 |
| 2014/0176824 A1* | 6/2014 | Kim | G06F 3/045 349/12 |
| 2015/0103500 A1* | 4/2015 | Bae | H01L 24/06 361/749 |
| 2016/0100483 A1* | 4/2016 | Hwang | H05B 33/06 313/505 |
| 2017/0013722 A1* | 1/2017 | Kim | H01L 24/27 |
| 2017/0040386 A1* | 2/2017 | Miyamoto | G06F 3/0443 |
| 2017/0135209 A1* | 5/2017 | Kim | H05K 1/09 |

* cited by examiner

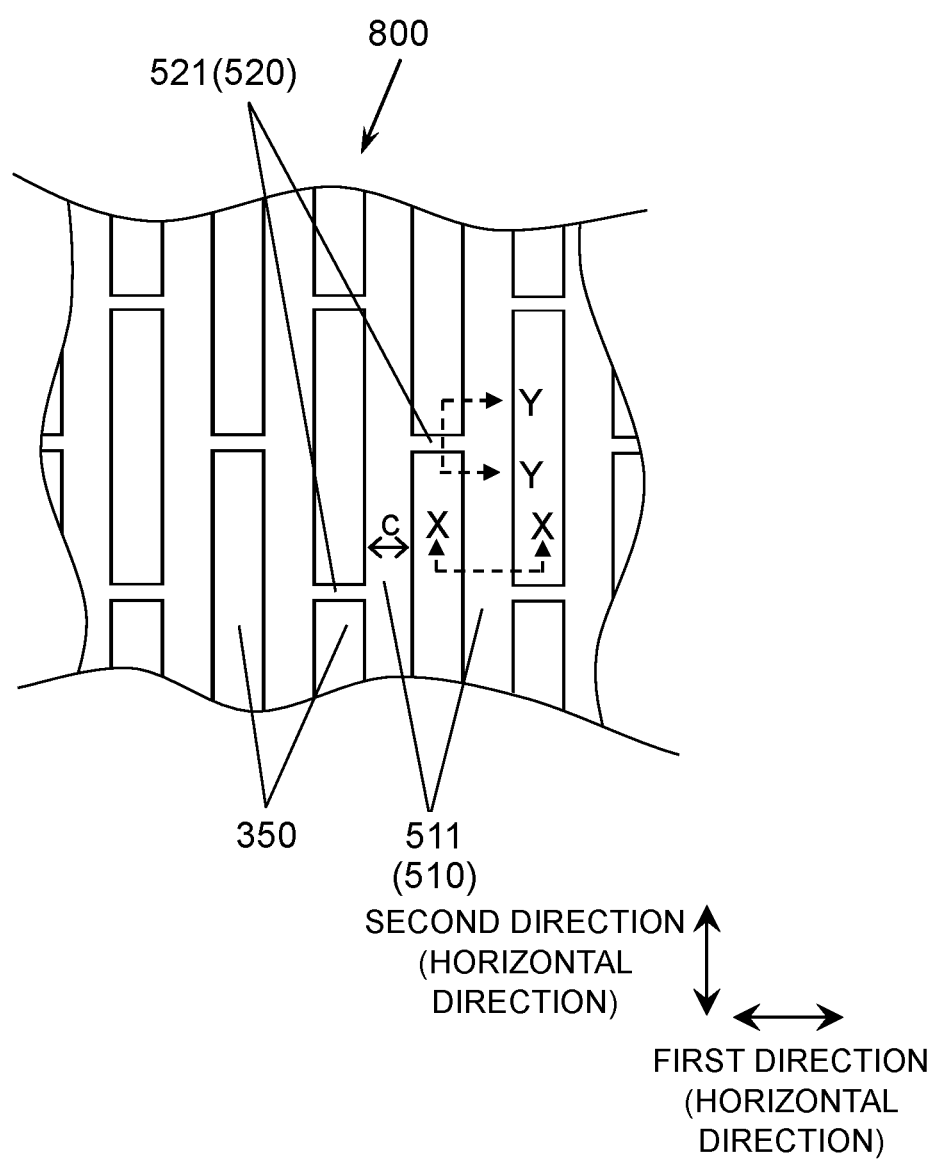

TOUCH SENSOR

CROSS-REFERENCE TO RELATED APPLICATIONS

This application is a U.S. national stage application of the PCT International Application No. PCT/JP2018/008925 filed on Mar. 8, 2018, which claims the benefit of foreign priority of Japanese patent application No. 2017-048084 filed on Mar. 14, 2017, the contents all of which are incorporated herein by reference.

TECHNICAL FIELD

The present disclosure relates to a touch sensor used for an input operation part each of various kinds of electronic devices.

BACKGROUND ART

Various kinds of electronic devices each have an input operation part. There may be a case where an electrostatic capacitance type touch sensor having transparency is mounted on the input operation part.

The electrostatic capacitance type touch sensor has: a substrate portion formed of a resin sheet on which a sensor electrode is arranged; and a flexible printed circuit board mounted on the substrate portion. The substrate portion has a mounting portion for mounting the flexible printed circuit board (hereinafter, described as "FPC mounting portion"). The FPC mounting portion includes wires arranged on a surface of the substrate portion in an overlapping manner. The flexible printed circuit board has a portion to be mounted where a connection terminal is arranged. Further, the portion to be mounted of the flexible printed circuit board is adhered to the FPC mounting portion of the substrate portion by thermocompression bonding via an anisotropic conductive adhesive agent.

CITATION LIST

Patent Literature

PTL 1: JP 2014-81870 A

SUMMARY OF THE INVENTION

A touch sensor of this disclosure includes: a printed circuit board having a connection terminal; a substrate portion having a mounting portion on which the printed circuit board is mounted, the printed circuit board mounted on a surface of the substrate portion; a conductive layer disposed on the mounting portion of the substrate portion; and an adhesive agent connecting the connection terminal and the conductive layer to each other. The adhesive agent is an anisotropic conductive adhesive agent and contains a plurality of conductive powder particles, a plurality of linear projections arranged in a first direction and extending in a second direction intersecting with the first direction are disposed on the surface of the substrate portion at the mounting portion, the conductive layer is disposed on a groove portion positioned between linear projections disposed adjacently to each other, wherein the plurality of linear projections includes the linear projections disposed adjacently to each other, the plurality of linear projections include a first linear projection and a second linear projection disposed adjacently to the first linear projection, the groove portion includes a first groove that is positioned between the first linear projection and the second linear projection, a third direction is a direction orthogonal to the first direction and the second direction, and a length in the third direction from an inner bottom portion of the first groove to a distal end of the first linear projection is shorter than a length in the third direction from the inner bottom portion of the first groove to a surface of the substrate portion disposed adjacently to the mounting portion.

BRIEF DESCRIPTION OF THE DRAWINGS

FIG. 4 is a schematic view showing a shape of a groove of the FPC mounting portion as viewed in a plan view.

DESCRIPTION OF EMBODIMENT

Before the exemplary embodiment is described, a drawback of the above-mentioned electrostatic capacitance type touch sensor is described. In connecting wires formed on the FPC mounting portion and the connection terminal of the flexible printed circuit board to each other using an anisotropic conductive adhesive material, connection surfaces of the wires and the connection terminal are each flat. The respective connection surfaces are flat and hence, there exists a possibility that conductive powder particles dispersed in the anisotropic conductive adhesive agent move at the time of performing thermocompression bonding. In view of the above, in the above-mentioned touch sensor, it is difficult to restrict movement of the conductive powder particles. Accordingly, it is necessary to set a distance between wires of the FPC mounting portion to a predetermined distance or more and hence, it is difficult to narrow a pitch between the wires of the FPC mounting portion.

The touch sensor of this disclosure can suppress the movement of the conductive powder particles, thus capable of narrowing a distance between wires formed on an FPC mounting portion.

Hereinafter, the touch sensor according to this exemplary embodiment is described with reference to drawings.

In this disclosure, there may be a case where the description is made by using terms indicating directions of "up", "down", "upward", "downward" and the like. However, these terms merely show the relative positional relationship of constitutional elements, and this disclosure is not limited to such a positional relationship. In this disclosure, the description is made by using a flexible printed circuit board as a printed circuit board connected to touch sensor 1. However, the printed circuit board connected to touch sensor 1 is not limited to the flexible printed circuit board.

(Exemplary Embodiment)

Figure 1:
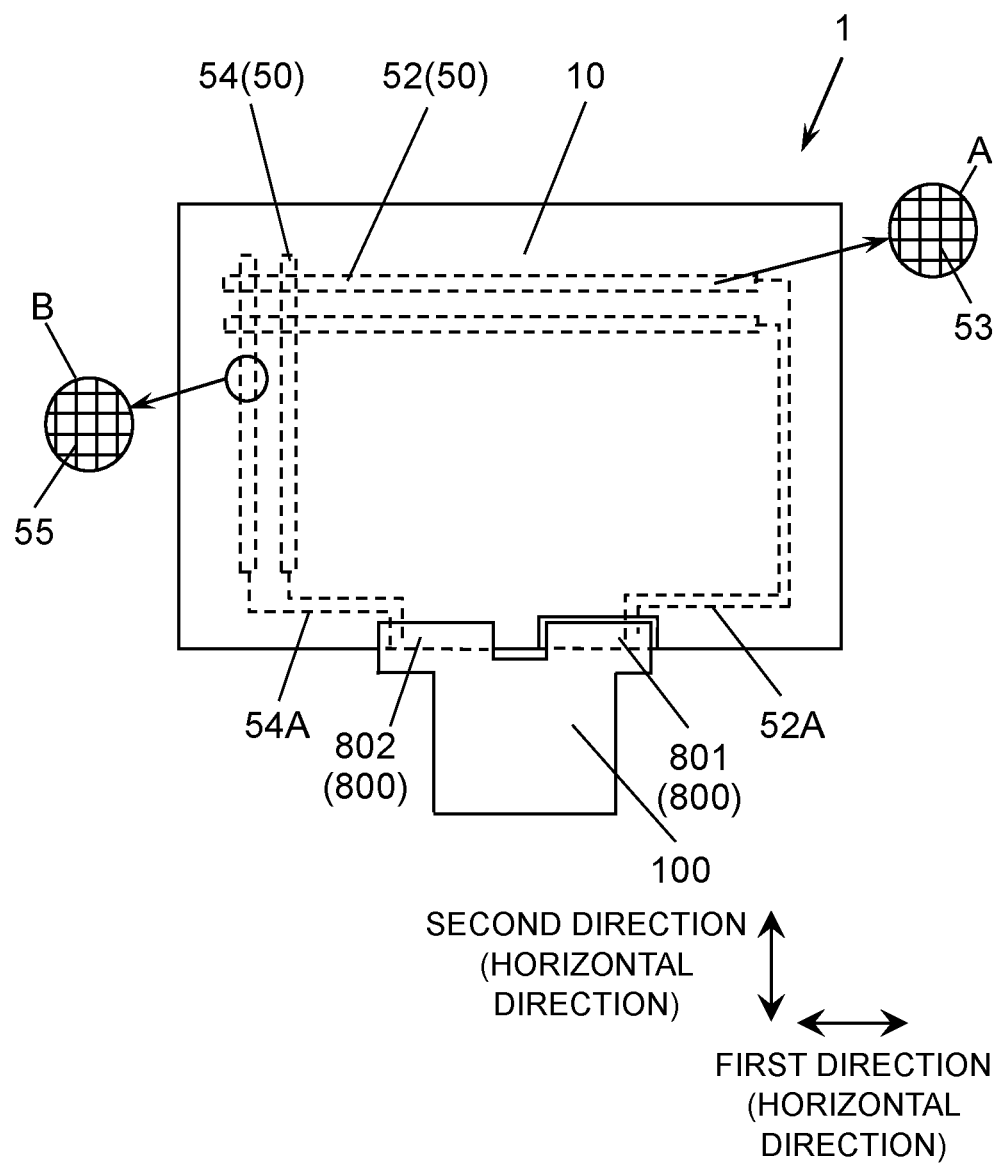
FIG. 1 is a plan view schematically showing a touch sensor of this exemplary embodiment.
Figure 2:
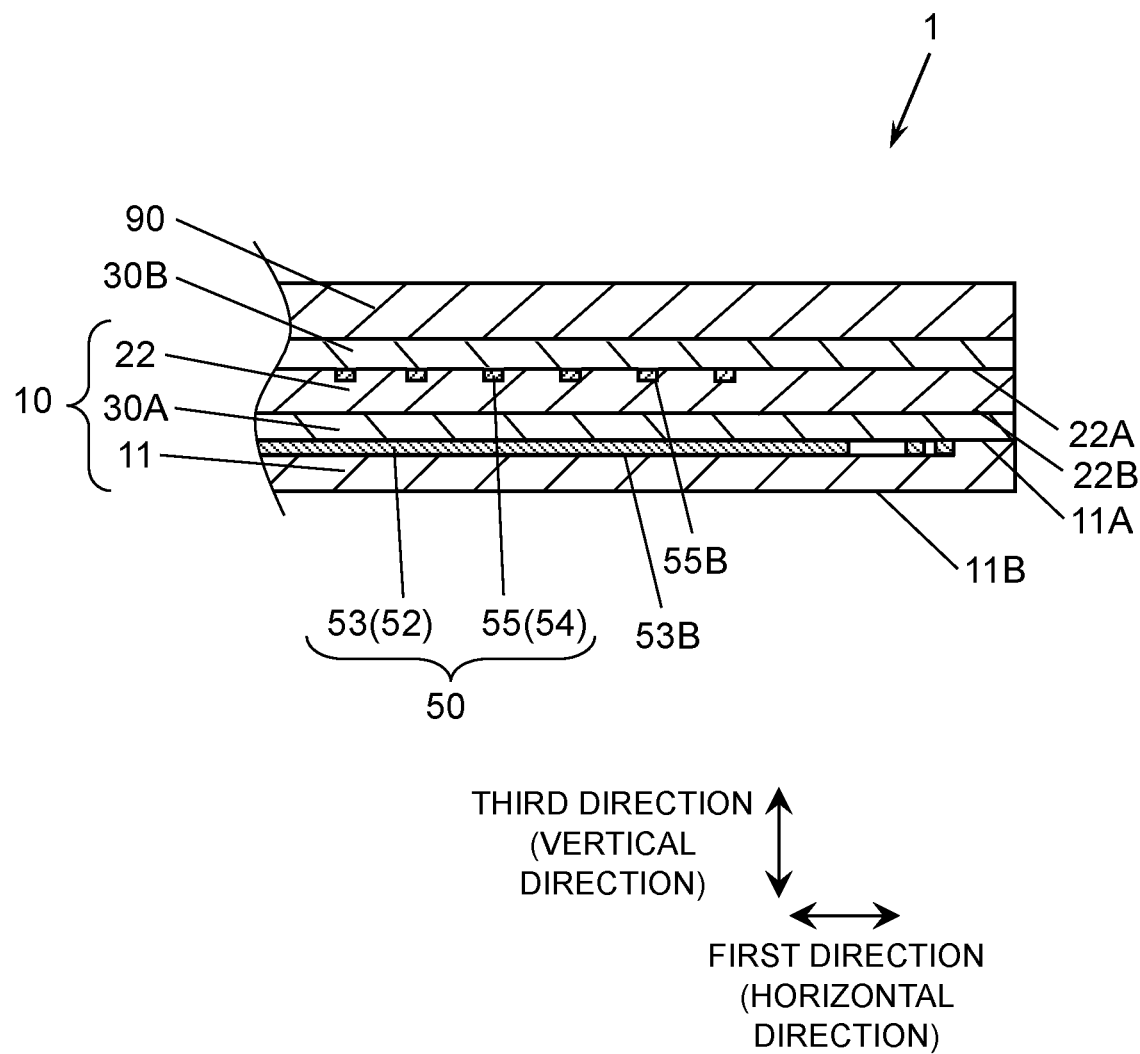
FIG. 2 is a cross-sectional view schematically showing the touch sensor of this exemplary embodiment.

FIG. 1 is a plan view schematically showing a touch sensor according to this exemplary embodiment, and FIG. 2 is a cross-sectional view schematically showing the touch sensor according to this exemplary embodiment.

As shown in FIG. 1, electrostatic capacitance type touch sensor 1 includes substrate portion 10 having sensor electrode 50 and flexible printed circuit board 100. Flexible printed circuit board 100 is mounted on substrate portion 10, and is configured to connect substrate portion 10 and an external circuit (not shown in the drawing) to each other. Hereinafter, one example of touch sensor 1 is described with reference to FIG. 1 and FIG. 2. Substrate portion 10 and sensor electrode 50 are not limited to the configuration shown in FIG. 1 and FIG. 2.

As shown in FIG. 2, substrate portion 10 includes first board 11, second board 22, sensor electrodes 50, and adhesive layer 30A. Adhesive layer 30A adheres first board 11 and second board 22 to each other. Sensor electrodes 50 are formed on first board 11 and second board 22. Further, cover member 90 is formed on second board 22, and cover member 90 and second board 22 are adhered to each other by adhesive layer 30B. Cover member 90 is a so-called cover lens. In this exemplary embodiment, the description is made by taking the case where adhesive layer 30B and cover member 90 are not included in substrate portion 10. However, adhesive layer 30B and cover member 90 may be handled as parts of substrate portion 10.

As shown in FIG. 1, sensor electrode 50 is formed of a plurality of transmission electrodes 52 formed on first board 11, and a plurality of reception electrodes 54 formed on second board 22.

Part A of FIG. 1 is a partially enlarged view of transmission electrodes 52. As shown in part A of FIG. 1, each transmission electrode 52 is formed of conductive layers 53 which are connected in a mesh shape. Transmission electrodes 52 extend in a first direction as a whole. The plurality of transmission electrodes 52 are arranged in a juxtaposed manner in a second direction orthogonal to the first direction. The plurality of transmission electrodes 52 are arranged substantially parallel to each other.

Part B of FIG. 1 is a partially enlarged view of reception electrode 54. As shown in part B of FIG. 1, each reception electrode 54 is formed of conductive layers 55 which are connected in a mesh shape. Reception electrodes 54 extend in the second direction as a whole. The plurality of reception electrodes 54 are arranged in a juxtaposed manner in the first direction. The plurality of reception electrodes 54 are arranged substantially parallel to each other.

In this exemplary embodiment, the description is made by taking the case where the direction that transmission electrodes 52 extend as a whole and the direction that the plurality of transmission electrodes 52 are arranged in a juxtaposed manner are orthogonal to each other as an example. However, the direction that transmission electrodes 52 extend as a whole and the direction that the plurality of transmission electrodes 52 are arranged in a juxtaposed manner are not always necessary to be orthogonal to each other, and it is sufficient that the direction that transmission electrodes 52 extend as a whole and the direction that the plurality of transmission electrodes 52 are arranged in a juxtaposed manner intersect with each other. It is preferable that the direction that transmission electrodes 52 extend as a whole and the direction that the plurality of transmission electrodes 52 are arranged in a juxtaposed manner be orthogonal to each other. In the same manner, it is preferable that the direction that reception electrodes 54 extend as a whole and the direction that the plurality of reception electrodes 54 are arranged in a juxtaposed manner be orthogonal to each other. However, it is sufficient that the direction that reception electrodes 54 extend as a whole and the direction that the plurality of reception electrodes 54 are arranged in a juxtaposed manner intersect with each other. It is preferable that the plurality of transmission electrodes 52 and the plurality of reception electrodes 54 be arranged orthogonal to each other.

The plurality of respective transmission electrodes 52 are connected to one ends of corresponding wires 52A. Wires 52A are routed around a peripheral edge portion of first board 11. The other ends of wires 52A are arranged on FPC mounting portion 801 of first board 11. Transmission electrodes 52 and wires 52A may be integrally formed with each other.

In the same manner as transmission electrodes 52, the plurality of respective reception electrodes 54 are connected to one ends of corresponding wires 54A. Wires 54A are routed around a peripheral edge portion of second board 22, and the other ends of wires 54A are arranged on FPC mounting portion 802 of second board 22. Reception electrodes 54 and wires 54A may be integrally formed with each other.

In FIG. 1, for facilitating understanding of the configuration, transmission electrodes 52, reception electrodes 54, wires 52A, and wires 54A are partially shown. In an actual configuration, transmission electrodes 52 and reception electrodes 54 are arranged within a predetermined region at a center portion of substrate portion 10.

FPC mounting portion 801 of first board 11 and FPC mounting portion 802 of second board 22 are each disposed in the vicinity of a peripheral edge portion of the same side of substrate portion 10. In the exemplary embodiment shown in FIG. 1, both of FPC mounting portion 801 and FPC mounting portion 802 are arranged near a lower side of rectangular substrate portion 10 in the drawing.

Transmission electrode 52 is formed of conductive layers 53 having a narrow width which are connected in a mesh shape as viewed in a plan view. A raw material for forming conductive layers 53 is a conductive metal such as copper. A width size of conductive layer 53 is less than or equal to 5 μm, for example. As shown in FIG. 2, conductive layers 53 are arranged in grooves 53B formed on surface 11A of first board 11. Grooves 53B are formed such that grooves 53B are recessed downward from surface 11A of first board 11. Grooves 53B are formed using an imprint method or the like, for example. Conductive layers 53 are formed by plating or the like. As another method, conductive layers 53 may be formed by arranging a resin having conductivity in grooves 53B. Wires 52A are disposed in grooves formed so as to be recessed downward from surface 11A of first board 11 in the same manner as transmission electrodes 52. The grooves are formed using an imprint method or the like, for example. When an imprint method is used, it is preferable that the position of inner bottom portions of grooves 53B where conductive layers 53 are disposed and the position of inner bottom portions of grooves (not shown in the drawing) where wires 52A are disposed in a vertical direction (third direction) be set at the same height. It is preferable that the inner bottom portions of both grooves be disposed parallel to surface 11A. Although the detailed configuration of the other ends of wires 52A is described later, a width size of the other end of wires 52A is set to 5 μm to 20 μm, for example.

Reception electrodes 54 and wires 54A mounted on second board 22 are also formed in the same manner as transmission electrode 52 and wires 52A. That is, reception electrode 54 is formed of conductive layers 55 having a narrow width which are connected with each other in a mesh shape as viewed in a plan view. A raw material for forming conductive layers 55 is conductive metal such as copper. A width size of conductive layer 55 is less than or equal to 5 µm, for example. As shown in FIG. 2, conductive layers 55 are disposed in grooves 55B formed on surface 22A of second board 22. Grooves 55B are formed such that grooves 55B are recessed downward from surface 22A of second board 22. Grooves 55B are formed using an imprint method or the like, for example. Conductive layers 55 are formed by plating or the like. As another method, conductive layers 55 may be formed by arranging a resin having conductivity in grooves 55B. Wires 54A are disposed in a groove formed so as to be recessed downward from surface 22A of second board 22 in the same manner as reception electrodes 54. The grooves are formed using an imprint method, for example. When an imprint method is used, it is preferable that the position of inner bottom portions of grooves 55B where conductive layers 55 are disposed and the position of inner bottom portions of grooves (not shown in the drawing) where wires 54A are disposed in a vertical direction (third direction) be set at the same height. It is preferable that the inner bottom portions of both grooves be disposed parallel to surface 22A. Although the detailed configuration of the other ends of wires 54A is described later, a width size of the other end of wire 54A is set to 5 µm to 20 µm, for example.

When a height position of conductive layer 53 arranged in groove 53B is lower than surface 11A, an insulating layer may be stacked on conductive layer 53 such that an upper surface of the insulating layer becomes equal to the height of surface 11A. That is, it is preferable that groove 53B be filled with the insulating layer. It is preferable that face 11B of first board 11 on a side opposite to surface 11A of first board 11 be formed of a flat face.

In the same manner, when a height position of conductive layer 55 disposed in groove 55B is lowered than surface 22A, an insulating layer may be stacked on conductive layer 55 such that an upper surface of the insulating layer becomes equal to the height of surface 22A. That is, it is preferable that groove 55B be filled with the insulating layer. Further, it is preferable that face 22B of second board 22 on a side opposite to surface 22A of second board 22 be formed in a flat face. When the insulating layer is formed on surface 22A of second board 22, the insulating layer may be used as a substitute for cover member 90. That is, in this case, cover member 90 and adhesive layer 30B become unnecessary.

In FIG. 2, first board 11 and second board 22 are each illustrated as being formed of a single-sheet constitutional member. When first board 11 and second board 22 are each formed of a single-sheet member, a material for forming first board 11 and second board 22 may be a resin for example. In place of forming each of first board 11 and second board 22 using a single-sheet member, the configuration may be adopted where first board 11 and second board 22 are mounted on a resin sheet, glass or the like. In a case where first board 11 and second board 22 are each formed using a resin such as an ultraviolet-curing-type acrylic resin, first board 11 and second board 22 can be easily formed by an imprint method, for example. The state of use where first board 11 (or second board 22) is used as a single body or the state of use where first board 11 (or second board 22) is used in the form that first board 11 (or second board 22) is mounted on another board may be suitably selected.

For example, touch sensor 1 of this exemplary embodiment may be formed such that touch sensor 1 does not have second board 22, and has only single-sheet first board 11. In this case, the configuration may be adopted where sensor electrodes are disposed only on one surface of first board 11. Alternatively, the configuration may be adopted where sensor electrodes are disposed both surfaces of first board 11.

Flexible printed circuit board 100 is mounted on substrate portion 10. The other ends of wires 52A are disposed on FPC mounting portion 801 of substrate portion 10. The other ends of wires 54A are disposed on FPC mounting portion 802 of substrate portion 10. The other ends of wires 52A and the other ends of wires 54A are electrically connected respectively to corresponding connection terminals of flexible printed circuit board 100 via anisotropic conductive adhesive agents. Touch sensor 1 is configured as described above.

[Summary of Configuration of FPC Mounting Portion 800]

Figure 3A:
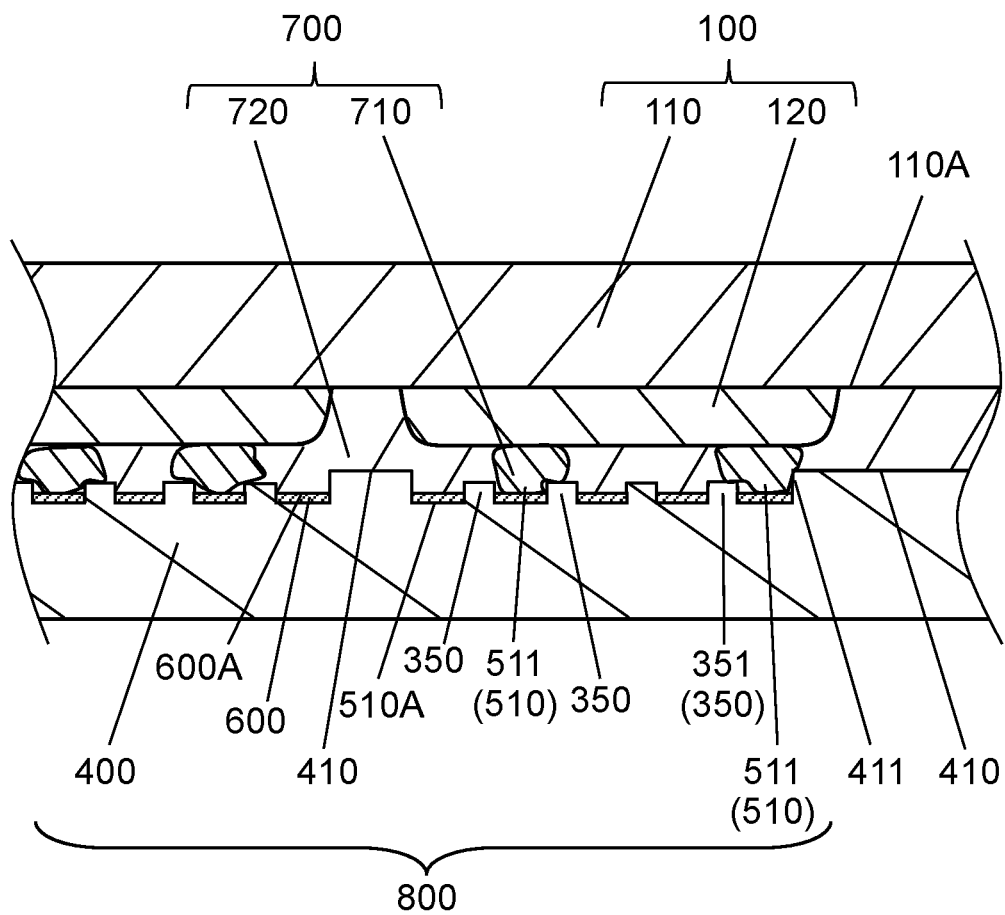
FIG. 3A is a cross-sectional view showing a part of a FPC mounting portion of the touch sensor.

Next, the detailed configuration of the FPC mounting portion of touch sensor 1 is described with reference to FIG. 1 to FIG. 4. FIG. 3A is a cross-sectional view showing a part of FPC mounting portion 800 of touch sensor 1. FIG. 3B to FIG. 3E are schematic views showing cross-sectional shapes of the substrate portion. FIG. 4 is a schematic view showing shapes of grooves as viewed from upper surfaces of FPC mounting portions 801, 802 of the touch sensor.

As shown in FIG. 1, touch sensor 1 is formed such that flexible printed circuit board 100 is mounted on FPC mounting portion 801 and FPC mounting portion 802 of substrate portion 10. FPC mounting portion 800 is mounted on each of first board 11 and second board 22. FPC mounting portion 801 of first board 11 is formed on a peripheral edge portion of first board 11, and includes the other ends of wires 52A. That is, FPC mounting portion 801 of first board 11 includes conductive layers 53 in the grooves. As shown in FIG. 1, the other ends of wires 52A extend in the second direction. The other ends of the plurality of wires 52A are arranged parallel to each other at an equal pitch in the first direction. In the same manner, FPC mounting portion 802 of second board 22 is formed on a peripheral edge portion of second board 22, and includes the other ends of wires 54A. That is, FPC mounting portion 802 of second board 22 includes conductive layers 55 in the grooves. As shown in FIG. 1, the other ends of wires 54A extend in the second direction. The other ends of the plurality of wires 54A are arranged parallel to each other at an equal pitch in the first direction.

FPC mounting portion 801 of first board 11 and FPC mounting portion 802 of second board 22 have substantially the same configuration.

[Detail of Configuration of FPC Mounting Portion 800]

Next, the detail of the configuration of FPC mounting portion 800 is described with reference to FIG. 3A to FIG. 4. A portion of substrate portion 10 shown in FIG. 1 which corresponds to FPC mounting portion 800 (FPC mounting portions 801, 802) is described as substrate portion 400 in FIG. 3A to FIG. 3E. In FIG. 3A to FIG. 3E, a left-and-right direction is the first direction (horizontal direction), a front-and-back direction is the second direction (horizontal direction), and an up-and-down direction is a third direction (vertical direction). In FIG. 4, a left-and-right direction is the first direction (horizontal direction), an up-and-down direction is the second direction (horizontal direction), and a front-and-back direction is the third direction (vertical direction). As described previously, it is preferable that the first direction and the second direction are orthogonal to each other.

As shown in FIG. 3A, a plurality of grooves 511 are formed on FPC mounting portion 800 so as to be recessed from surface 410 of substrate portion 400. Surface 410 corresponds to surface 11A or surface 22A in FIG. 2. The plurality of grooves 511 are referred to as groove portions 510. Groove portions 510 extend in the second direction. That is, each groove portion 510 is formed between neighboring two linear projections 350 extending substantially parallel to each other in the second direction.

Out of groove portions 510, groove 511 which is positioned at an outermost side (on a right side in this exemplary embodiment) in the first direction is formed between linear projection 351 positioned at an outermost side out of a plurality of linear projections 350 and inner wall 411 which is connected to surface 410 and extends downward in an approximately vertical direction.

Figure 3B:
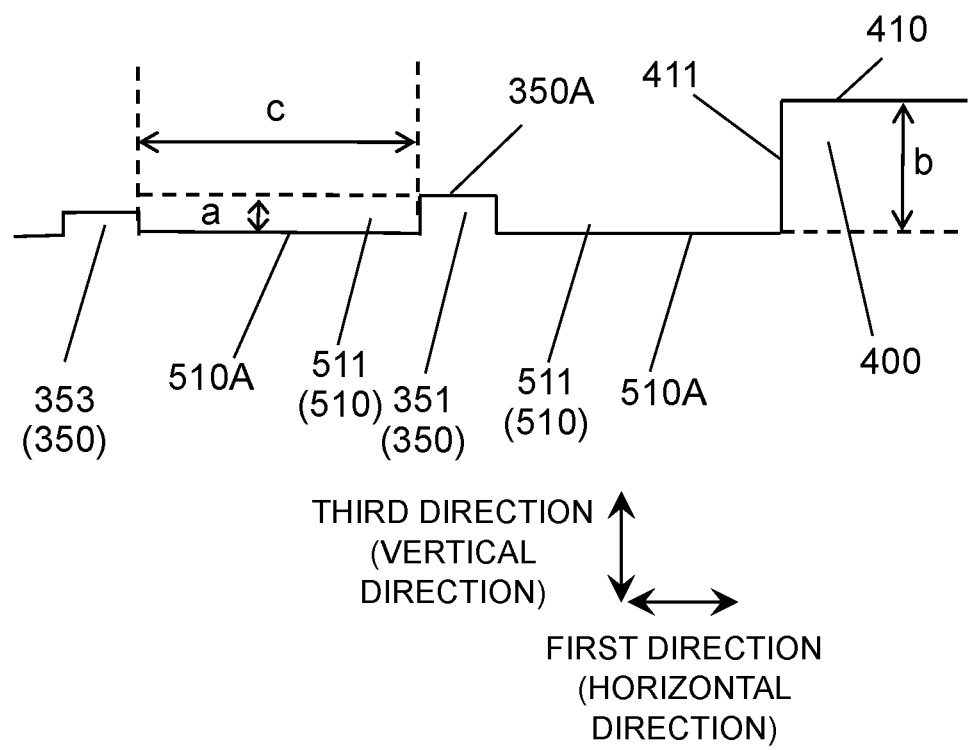
FIG. 3B is a schematic view showing a cross-sectional shape of a substrate portion in the FPC mounting portion.

The detailed configuration of groove portions 510 are described with reference to FIG. 3B. FIG. 3B is a schematic view showing a cross-sectional shape of substrate portion 400. A length (length a) in the third direction from inner bottom portion 510A of groove 511 to distal end 350A of linear projection 351 is shorter than a length (length b) in the third direction from inner bottom portion 510A of groove 511 to surface 410 of substrate portion 400.

As shown in FIG. 4, neighboring grooves 511 are connected to each other by grooves 521 which extend in the first direction. Groove 521 is formed between short side surfaces of two linear projections 350 arranged in a juxtaposed manner in the second direction. That is, the plurality of linear projections 350 having the same shape are arranged linearly in the second direction. A portion between neighboring two linear projections 350 arranged in a juxtaposed manner in the second direction out of the plurality of linear projections 350 is formed as groove 521. A plurality of grooves 521 are connected to one groove 511. It is preferable that groove 521 positioned on one side in the first direction of one groove 511 be disposed at a position displaced in the second direction with respect to groove 521 positioned on the other side in the first direction of one groove 511. In other words, it is preferable that the plurality of linear projections 350 disposed adjacently to each other in the first direction be arranged with the positional relationship where the plurality of linear projections 350 are displaced from each other in the second direction. Hereinafter, the plurality of grooves 521 extending in the first direction are collectively referred to as groove portions 520.

A cross-sectional shape of groove portion 510 taken along line X-X is an approximately rectangular shape. A cross-sectional shape of groove portion 520 taken along line Y-Y is also an approximately rectangular shape. A depth (a length in the third direction) of groove portion 510 and a depth (a length in the third direction) of groove portion 520 are equal. However, a width (a length in the second direction) of groove portion 520 may be narrower than a width (a length in the first direction) of groove portion 510. As shown in FIG. 3B, inner bottom portion 510A of groove portion 510 and the inner bottom portion (not shown in the drawing) of groove portion 520 are substantially parallel to surface 410.

As shown in FIG. 3A, conductive layer 600 is disposed in each of groove portions 510 and groove portions 520. For example, conductive layer 600 is disposed on each of inner bottom portions 510A of groove portions 510 and the inner bottom portions (not shown in the drawing) of groove portions 520. That is, conductive layer 600 has substantially the same shape as groove portion 510 and groove portion 520 as viewed in a plan view. As shown in FIG. 3A, a height position of an approximately center portion of surface 600A of conductive layer 600 in the third direction is lower than a height position of linear projection 350. The height position of surface 600A of conductive layer 600 in the third direction may be substantially equal to the height position of linear projection 350. The height position of surface 600A other than the approximately center portion of surface 600A may be lower than the height position of linear projection 350 or may be substantially equal to the height position of linear projection 350. FPC mounting portion 800 is formed as described above.

As shown in FIG. 3A, flexible printed circuit board 100 (printed circuit board) is mounted on FPC mounting portion 800 of substrate portion 10. A portion to be mounted of flexible printed circuit board 100 has base material 110 and connection terminals 120. Wires (not shown in the drawing) are disposed on base material 110, and the wires are electrically connected with connection terminal 120. Flexible printed circuit board 100 is disposed on substrate portion 10 such that connection terminals 120 opposedly faces FPC mounting portion 800. The portion to be mounted of flexible printed circuit board 100 is adhered to FPC mounting portion 800 by thermocompression bonding via anisotropic conductive adhesive agent 700. Anisotropic conductive adhesive agent 700 contains conductive powder particles 710 and resin portion 720. In a state before thermocompression bonding is performed, conductive powder particles 710 are dispersed in resin portion 720, and portions of conductive powder particles 710 enter groove portion 510. After flexible printed circuit board 100 is mounted, conductive powder particles 710 are brought into a collapsed state (see FIG. 3A). That is, conductive powder particles 710 have a particle diameter where, before thermocompression bonding of flexible printed circuit board 100 is performed, a portion of one conductive powder particle 710 enters one groove portion 510 and is brought into contact with conductive layer 600, and such one conductive powder particle 710 is brought into contact with connection terminal 120. For example, when a width of groove portion 510 is 5 μm to 15 μm, it is preferable that conductive powder particle 710 have a spherical outer shape, and have an average particle size of 4 μm to 12 μm, for example, with a particle size distribution of ±1 μm.

At the time of performing thermocompression bonding, conductive powder particles 710 may be brought into a movable state in resin portion 720. FPC mounting portion 800 has groove portions 510 and groove portions 520 and hence, conductive powder particles 710 which are positioned on surface 410 before thermocompression bonding move to groove portions 510 and the like near conductive powder particles 710 at the time of performing thermocompression bonding.

Figure 3C:
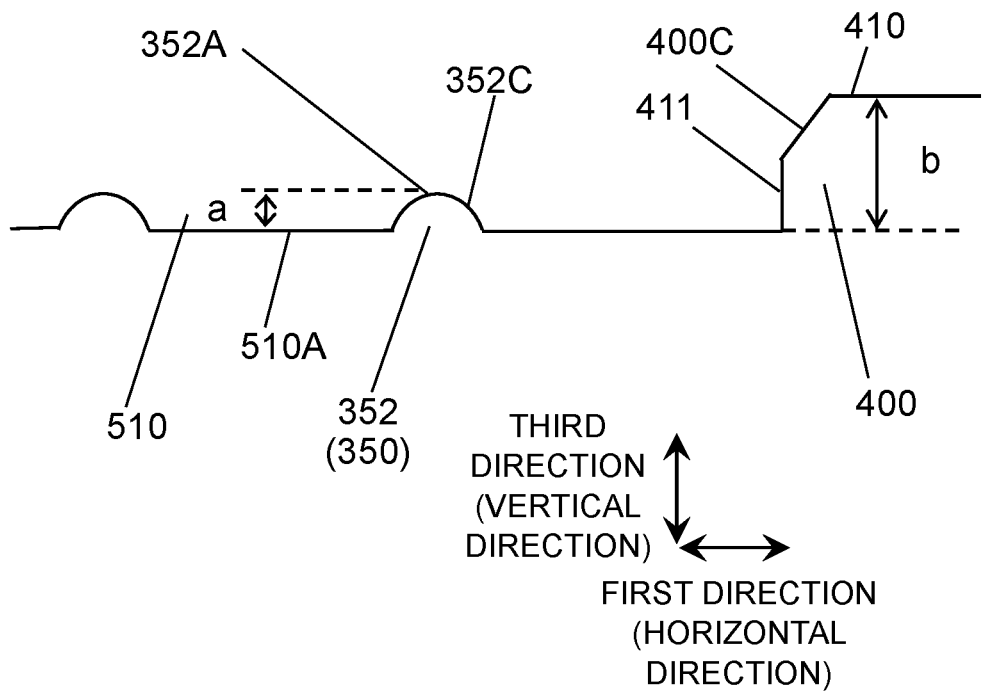
FIG. 3C is a schematic view showing a cross-sectional shape of the substrate portion in the FPC mounting portion.
Figure 3D:
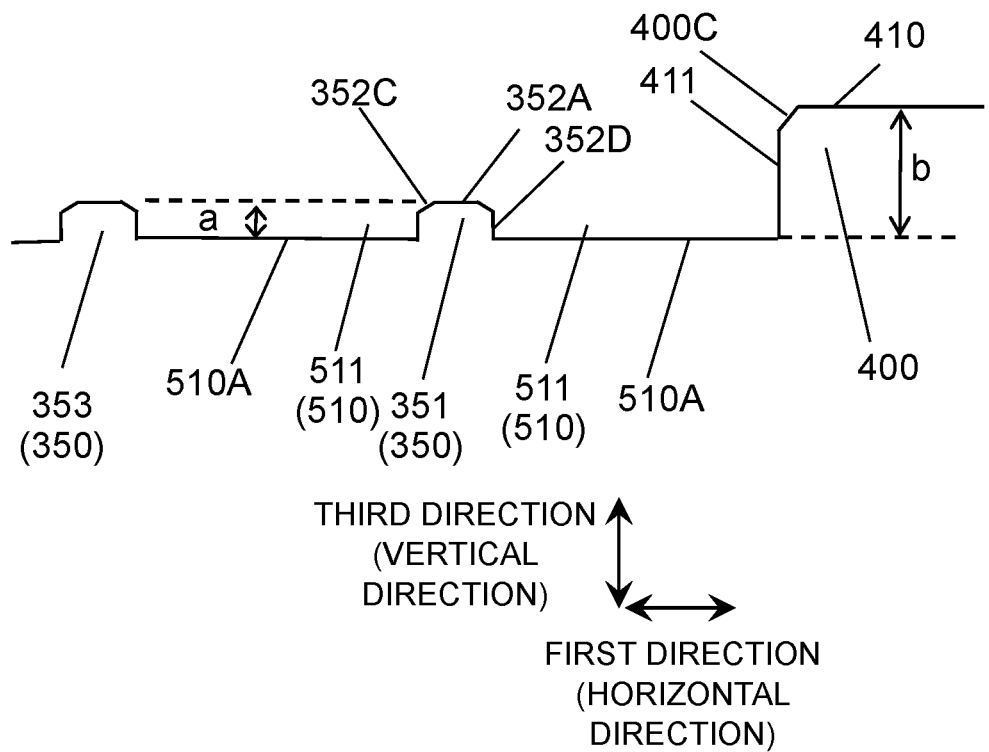
FIG. 3D is a schematic view showing a cross-sectional shape of the substrate portion in the FPC mounting portion.

To accelerate moving of conductive powder particles 710 to groove portions 510 and the like, it is preferable that, for example, as shown in FIG. 3C, substrate portion 400 formed of inner wall 411 and surface 410 have chamfered portion 400C. Due to substantially the same reason, it is preferable that, as shown in FIG. 3C, distal end 352A of linear projection 352 have chamfered portion 352C. As shown in FIG. 3D, chamfered portion 352C may have a flat face at a center position of distal end 352A, and a flat face may be formed also on each of side surfaces 352D of linear projection 352. With the configuration shown in FIG. 3D, the size control of linear projections 352 and groove portions 510 can be easily performed.

A shape of chamfered portion 400C or chamfered portion 352C as viewed in cross section may be an arc shape, a triangular shape or the like, and the shape is not limited to the shape shown in FIG. 3C and the shape shown in FIG. 3D. Substrate portion 400 shown in FIG. 3C and FIG. 3D has both of chamfered portions 400C and chamfered portions 352C. However, it is not always necessary for substrate portion 400 to have both of chamfered portion 400C and chamfered portion 352C, and it is sufficient for substrate portion 400 to have either one of these configurations.

Figure 3E:
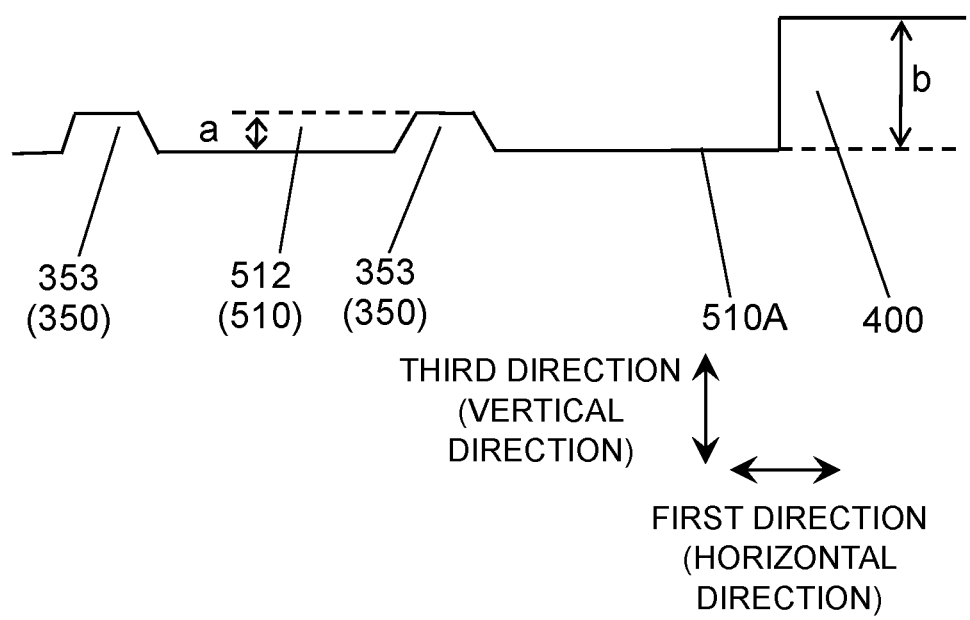
FIG. 3E is a schematic view showing a cross-sectional shape of the substrate portion in the FPC mounting portion.

As indicated as groove 512 in FIG. 3E, groove portion 510 may be formed into a shape where groove portion 510 is tapered in a direction from an opening side (an upper side of the drawing) toward a bottom surface side (a lower side of the drawing).

With the use of sheet-like anisotropic conductive adhesive agent 700 where conductive powder particles 710 slightly project from resin portion 720, when conductive powder particles 710 or portions of conductive powder particles 710 move into groove portion 510 or into groove portion 520, conductive powder particles 710 are easily brought into contact with conductive layer 600. Flexible printed circuit board 100 is adhered to substrate portion 400 by thermocompression bonding in a state where conductive powder particles 710 or portions of conductive powder particles 710 move into groove portions 510 (or groove portions 520). By performing such treatment, conductive power particles 710 are adhered by thermocompression bonding in a state where portions of conductive powder particles 710 stay in groove portions 510 (or groove portions 520). Accordingly, movement of conductive powder particles 710 at the time of thermocompression bonding can be suppressed. Further, conductive powder particle 710 is collapsed between conductive layer 600 and connection terminal 120 thus electrically connecting conductive layer 600 and connection terminal 120 to each other. Conductive powder particles 710 are adhered by thermocompression bonding in a state where conductive powder particles 710 are brought into contact with conductive layers 600 disposed on bottom surfaces of groove portions 510 (or groove portions 520) without returning to surface 410.

As can be clearly understood from the above-mentioned description, touch sensor 1 of this exemplary embodiment can acquire stability in electric connection between conductive layer 600 and connection terminal 120.

As shown in FIG. 3A, after thermocompression bonding is performed, one conductive powder particle 710 is formed into a collapsed shape where conductive powder particle 710 is formed of; a portion which enters groove portion 510 (or groove portion 520) between conductive layer 600 and connection terminal 120 and is brought into contact with conductive layer 600; and a portion which is placed on linear projection 350. With respect to conductive powder particle 710 having a collapsed shape, it is preferable that a ratio of the portion placed on linear projection 350 be set to less than approximately 40% of whole conductive powder particle 710.

As shown in FIG. 3B, the height (length a) of linear projection 350 is lower than the height (length b) of surface 410 and hence, as shown in FIG. 3A, at the time of performing thermocompression bonding, conductive powder particle 710 is positioned so as to stride over linear projection 350 and groove portion 510.

As can be clearly understood from the above-mentioned description, flexible printed circuit board 100 is mounted on FPC mounting portion 800 via anisotropic conductive adhesive agent 700. When conductive powder particles 710 positioned on surface 410 before thermocompression bonding enter groove portions 510 (or groove portion 520) at the time of performing thermocompression bonding, it is possible to prevent conductive powder particles 710 from returning to surface 410. Accordingly, a large number of conductive powder particles 710 contribute to the connection between conductive layers 600 disposed in groove portions 510 or groove portions 520 and connection terminal 120.

Accordingly, touch sensor 1 of this disclosure can set a ratio of a dispersion amount of conductive powder particles 710 which anisotropic conductive adhesive agent 700 contains to a small value while maintaining reliability in electrical connection.

When end portions of the plurality of wires 52A are arranged in a juxtaposed manner on FPC mounting portion 801, an arrangement pitch of wires 52A can be narrowed. In the same manner, when end portions of the plurality of wires 54A are arranged in a juxtaposed manner on FPC mounting portion 802, an arrangement pitch of wires 54A can be narrowed. When the first direction and the second direction are orthogonal to each other, designing and a control of touch sensor can be easily performed, and the increase in size of FPC mounting portions 801, 802 along the first direction can be also suppressed.

It is sufficient that the height of linear projection 350 be set lower than the height of surface 410. As shown in FIG. 3A, the plurality of linear projections 350 may have the same height. As shown in FIG. 3B, the plurality of linear projections 350 may have the different heights.

For example, as shown in FIG. 3B, when substrate portion 400 includes a plurality of linear projections 350 which extend in the second direction and are arranged substantially parallel to each other in the first direction, the height of linear projection 350 remote from a peripheral edge of FPC mounting portion 800 may be set lower than the height of linear projection 351 close to the peripheral edge of FPC mounting portion 800. By lowering the height of linear projection 350 on a center side, conductive powder particles 710 are easily collected to the center side. With such a configuration, a ratio that conductive powder particles 710 are interposed at the center side and an area near the center side can be increased.

In FIG. 3B, only two linear projections which differ from each other in height (linear projection 351 and linear projection 353) are shown for facilitating understanding of the description. However, a larger number of linear projections 350 are formed on substrate portion 400 in an actual touch sensor.

As shown in FIG. 3B, it is sufficient that a ratio between a width (length c) and a depth (length a) of groove portion 510 be suitably set. However, it is preferable that a ratio (c/a) of the width with respect to the depth be set to 3 or more. With the provision of groove portions 510 having such a configuration, there is a high probability that conductive powder particles 710 which enter groove portions 510 are brought into contact with conductive layer 600.

It is more desirable that, a ratio of the width of groove portion 510 with respect to the depth of the groove portion 510 be set to 5 or more for substantially the same reason.

In this exemplary embodiment, the description is made with respect to touch sensor 1 having the configuration where flexible printed circuit board 100 is mounted only on an outer surface of substrate portion 10 on one side. Flexible printed circuit board 100 may be mounted on each of both outer surface sides of substrate portion 10 in the third direction.

In the above-mentioned exemplary embodiment, as shown in FIG. 2, substrate portion 10 is formed of two boards (first board 11 and second board 22). However, the present invention is not limited to such a configuration. For example, substrate portion 10 may be formed of one board. In FIG. 2, although transmission electrodes 52 are disposed on first board 11, and reception electrodes 54 are disposed on second base material 22, both transmission electrodes 52 and reception electrodes 54 may be disposed on the same board.

In the above-mentioned exemplary embodiment, as shown in FIG. 2, conductive layers 53 are disposed on the upper surface (surface 11A) of first board 11, conductive layers 55 are disposed on the upper surface (surface 22A) of second board 22, and the lower surface (surface 22B) of second board 22 is adhered to the upper surface (surface 22A) of first board 11 thus forming substrate portion 10. However, the present invention is not limited to such a shape. For example, substrate portion 10 may be formed by adhering a lower surface (face 11B) of first board 11 and a lower surface (face 22B) of second board 22 to each other.

In the above-mentioned exemplary embodiment, as shown in FIG. 2, cover member 90 is disposed on the upper surface (surface 22A) of substrate portion 10. However, the present invention is not limited to such an arrangement. For example, cover member 90 may be disposed on the lower surface (face 11B) of substrate portion 10.

In the above-mentioned exemplary embodiment, as shown in FIG. 3A, flexible printed circuit board 100 is disposed on the upper surface (surface 410) of substrate portion 400. However, conductive layer 600 may be disposed on the lower surface of substrate portion 400, and flexible printed circuit board 100 may be disposed on the lower surface of substrate portion 400.

(Conclusion)

Touch sensor 1 of this disclosure includes: flexible printed circuit board 100 (printed circuit board) having connection terminal 120; substrate portion 400 having a surface thereof on which flexible printed circuit board 100 is mounted and having FPC mounting portion 800 on which flexible printed circuit board 100 is mounted; conductive layer 600 which is disposed on FPC mounting portion 800 of substrate portion 400; and anisotropic conductive adhesive agent 700 for mounting connection terminal 120 and conductive layer 600 on each other. Anisotropic conductive adhesive agent 700 includes conductive powder particles 710. On surface 410 of substrate portion 400 of FPC mounting portion 800, linear projections 350 which are arranged in the first direction and extend in the second direction are disposed. Conductive layer 600 is disposed in groove portion 510 which is positioned between linear projections 350 disposed adjacently to each other, wherein linear projections 350 includes linear projections 350 disposed adjacently to each other. As shown in FIG. 3B, groove portions 510 include grooves 511 each of which is positioned between linear projection 351 and linear projection 353 disposed adjacently to such linear projection 351. Length a in the third direction from inner bottom portion 510A of groove 511 to distal end 350A of linear projection 351 is shorter than length b in the third direction from inner bottom portion 510A of groove 511 to surface 410 of substrate portion 400 disposed adjacently to the mounting portion.

Touch sensor 1 may be further configured as follows. Connection terminal 120 and conductive layer 600 are electrically connected with each other by at least one conductive powder particle 710, and a portion of one conductive powder particle 710 is brought into contact with conductive layer 600, and an another portion of conductive powder 710 is brought into contact with distal end 350A of linear projection 351.

It is more preferable that, in touch sensor 1, a ratio of a width (length c) of groove 511 with respect to a depth (length a) of groove 511 be set to 3 or more.

Touch sensor 1 may further include grooves 521 each of which connects grooves 511 disposed adjacently to each other. Further, it is preferable that inner bottom portion 510A of groove 511 and the inner bottom portion of groove 521 are disposed at the same position in the third direction.

As shown in FIG. 3C, it is preferable that touch sensor 1 be configured such that an end of surface 410 of substrate portion 400 disposed adjacently to linear projection 351 has chamfered portion 400C. It is preferable that the distal end of linear projection 352 have chamfered portion 352C.

As shown in FIG. 3E, in touch sensor 1, it is preferable that groove 512 be disposed in a shape tapered in a direction from an opening side toward the inner bottom portion.

INDUSTRIAL APPLICABILITY

In the touch sensor according to this disclosure, the distance between the plurality of wires disposed on the FPC mounting portion can be narrowed. The touch sensor according to this disclosure is usefully applicable to various kinds of electronic devices.

REFERENCE MARKS IN THE DRAWINGS

1: touch sensor
10: substrate portion
11: first board
11A, 22A: surface
11B, 22B: face
22: second board
30A, 30B: adhesive layer
50: sensor electrode
52: transmission electrode
52A, 54A: wire
53, 55, 600: conductive layer
53B, 55B: groove
54: reception electrode
90: cover member
100: flexible printed circuit board (printed circuit board)
110: base material
110A: surface
120: connection terminal
350, 351, 352, 353: linear projection
350A, 352A: distal end
352C: chamfered portion
400: substrate portion
400C: chamfered portion
410: surface
411: inner wall
510: groove portion
510A: inner bottom portion
511, 512: groove
520: groove portion
521: groove
600A: surface
700: anisotropic conductive adhesive agent
710: conductive powder particle
720: resin portion
800, 801, 802: FPC mounting portion

The invention claimed is:

1. A touch sensor comprising:
a printed circuit board having a connection terminal;
a substrate portion having a mounting portion on which the printed circuit board is mounted, the printed circuit board mounted on a surface of the substrate portion;
a conductive layer disposed on the mounting portion of the substrate portion; and an adhesive agent connecting the connection terminal and the conductive layer to each other,
wherein
the adhesive agent is an anisotropic conductive adhesive agent and contains a plurality of conductive powder particles,
a plurality of linear projections arranged in a first direction and extending in a second direction intersecting with the first direction are disposed on the surface of the substrate portion at the mounting portion,
the conductive layer is disposed on a groove portion positioned between linear projections disposed adjacently to each other, wherein the plurality of linear projections includes the linear projections disposed adjacently to each other,
the plurality of linear projections include a first linear projection and a second linear projection disposed adjacently to the first linear projection,
the groove portion includes a first groove that is positioned between the first linear projection and the second linear projection,
a third direction is a direction orthogonal to the first direction and the second direction, and
a length in the third direction from an inner bottom portion of the first groove to a distal end of the first linear projection is shorter than a length in the third direction from the inner bottom portion of the first groove to a surface of the substrate portion disposed adjacently to the mounting portion.

2. The touch sensor according to claim 1, wherein the first direction and the second direction are orthogonal to each other.

3. The touch sensor according to claim 1, wherein
the connection terminal and the conductive layer are electrically connected with each other by at least one of the plurality of conductive powder particles,
a portion of the at least one of the plurality of conductive powder particles is brought into contact with the conductive layer, and
an another portion of the at least one of the plurality of conductive powder particles is brought into contact with a distal end of at least one of the plurality of linear projections.

4. The touch sensor according to claim 1, wherein
the groove portion further includes:
    a second groove disposed adjacently to the first groove; and
    a third groove which connects the first groove and the second groove to each other, and
the conductive layer is disposed in the third groove.

5. The touch sensor according to claim 4, wherein the inner bottom portion of the first groove and an inner bottom portion of the third groove are disposed at a same position in the third direction.

6. The touch sensor according to claim 1, wherein an end of the surface of the substrate portion disposed adjacently to the first linear projection has a chamfered portion.

7. The touch sensor according to claim 1, wherein a distal end of the first linear projection has a chamfered portion.

8. The touch sensor according to claim 1, wherein the first groove has a shape tapered in a direction from an opening side toward the inner bottom portion.

* * * * *